US009000653B2

(12) United States Patent
Fraser et al.

(10) Patent No.: US 9,000,653 B2
(45) Date of Patent: Apr. 7, 2015

(54) ULTRASOUND TRANSDUCER ARRAYS

(75) Inventors: John Fraser, Woodinville, WA (US); Benoit Dufort, Stoneham, MA (US)

(73) Assignee: Koninklijke Philips N.V., Eindhoven (NL)

( * ) Notice: Subject to any disclaimer, the term of this patent is extended or adjusted under 35 U.S.C. 154(b) by 1877 days.

(21) Appl. No.: 12/063,181

(22) PCT Filed: Jul. 19, 2006

(86) PCT No.: PCT/IB2006/052475

§ 371 (c)(1), (2), (4) Date: Feb. 7, 2008

(87) PCT Pub. No.: WO2007/017775

PCT Pub. Date: Feb. 15, 2007

(65) Prior Publication Data

US 2010/0141093 A1 Jun. 10, 2010

Related U.S. Application Data

(60) Provisional application No. 60/706,398, filed on Aug. 8, 2005.

(51) Int. Cl.
*H01L 41/09* (2006.01)
*B06B 1/02* (2006.01)

(52) U.S. Cl.
CPC .................................... *B06B 1/0207* (2013.01)

(58) Field of Classification Search
USPC .......................................... 310/322, 334, 335
See application file for complete search history.

(56) References Cited

U.S. PATENT DOCUMENTS

| | | | |
|---|---|---|---|
| 5,596,292 A | 1/1997 | Pezzani | |
| 5,789,846 A | 8/1998 | Brown | |
| 5,990,598 A | 11/1999 | Sudol | |
| 6,314,057 B1 | 11/2001 | Solomon | |
| 6,380,766 B2 | 4/2002 | Savord | |
| 6,396,199 B1 * | 5/2002 | Douglas et al. | 310/335 |
| 6,537,216 B1 | 3/2003 | Shifrin | |
| 6,592,525 B2 | 7/2003 | Miller | |
| 6,784,600 B2 | 8/2004 | Klee | |
| 7,230,368 B2 * | 6/2007 | Lukacs et al. | 310/335 |
| 7,267,008 B2 * | 9/2007 | Gordon et al. | 73/587 |
| 2002/0156379 A1 | 10/2002 | Angelsen | |
| 2003/0228021 A1 | 12/2003 | Letinturier | |
| 2004/0000841 A1 | 1/2004 | Phelps | |

FOREIGN PATENT DOCUMENTS

| | | | |
|---|---|---|---|
| GB | 2091495 | A | 7/1982 |
| JP | 01220615 | A | 9/1989 |
| JP | 02107236 | A | 4/1990 |
| JP | 61 110051 | A | 5/1996 |
| JP | 0961523 | A | 3/1997 |
| JP | 9187099 | | 7/1997 |
| WO | 2007010460 | A | 1/2007 |

* cited by examiner

*Primary Examiner* — Derek Rosenau

(57) ABSTRACT

A transducer array of micromachined ultrasonic transducer elements is connected to a microbeamformer. Driver circuits of the microbeamformer have a first output coupled to a first electrode of a respective transducer element and a second output coupled to a second electrode of the respective transducer element. The driver circuits apply first and second time varying voltage signals to the electrodes, with one voltage signal being time inverted relative to the other. The peak-to-peak voltage applied to the transducer element is 1.75 to 2.0 times the peak-to-peak voltage of either the first or the second time varying voltage signal.

11 Claims, 3 Drawing Sheets

ULTRASOUND TRANSDUCER ARRAYS

Ultrasound (ultrasonic) transducers are devices that convert an electrical signal into an ultrasonic signal, and vice versa. Ultrasonic transducers have been employed in a wide variety of applications to non-invasively interrogate solids, liquids and gases.

One application in which ultrasonic transducers have been widely employed is medical imaging. Many ultrasonic transducers used in medical imaging are piezoelectric devices. For example, the elements may be made of lead zirconate titanate (PZT) and formed into an array, which forms the transducer assembly. The transducer assembly may include a one-dimensional array of transducer elements or a two-dimensional array of elements. The former provides a two-dimensional image of the interrogated specimen and the latter provides a three-dimensional image of the specimen.

An ultrasonic probe includes the transducer assembly provided in a housing that may include control electronics and impedance matching layers. The ultrasonic probe may then be used to send ultrasonic signals into the human body, receive reflected ultrasonic signals from the body and convert the reflected ultrasonic signals into electrical signals. The electrical signals may then transmitted via a plurality of coaxial cables from the probe to an electronic device, which processes the electrical signals and forms the two-dimensional image or the three dimensional image of the interrogated portion of the body.

One type of transducer that has garnered attention in medical imaging is the piezoelectric micromachined transducer (PMUT). PMUTs are fabricated in arrays using known semiconductor fabrication techniques and provide imaging capabilities without the need for impedance matching layers. The resultant structure includes an array of elements each comprising a flexible membrane disposed over a silicon substrate. Application of a voltage across the active piezoelectric layer(s) of the PMUT results in the transmission of an ultrasonic signal.

As medical imaging has evolved as a viable non-invasive method of imaging a portion of the human body, the demands for increased imaging capabilities continue to increase. For example, it is known that ultrasonic waves attenuate rather sharply with depth into the body. In order to image more deeply into the body, it is useful to provide ultrasonic signals with substantial intensity. This requires greater voltage input to the transducer elements of the transducer array.

Unfortunately, providing voltages large enough to the transducer elements in order effect desired ultrasonic intensity levels has proven difficult in known two-dimensional arrays, which require a large number of elements.

What is needed, therefore, is an apparatus that overcomes at least the shortcomings of the known methods referred to above.

In accordance with an example embodiment, an ultrasonic transducer element (element) includes an active layer having a first side and a second side. The element also includes a first electrode connected to the first side and a second electrode connected to the first side. In addition, the element includes a circuit having a first output connected to the first electrode and a second output connected to the second electrode. The first output provides a first voltage to the first electrode and the second output provides a second voltage to the second electrode. The circuit provides a voltage to the active layer that is equal to approximately a difference between the first voltage and the second voltage.

In accordance with another example embodiment an ultrasonic transducer array includes a plurality of ultrasonic transducer elements. Each of the plurality of ultrasonic transducer elements includes an active layer having a first side and a second side; a first electrode connected to the first side and a second electrode connected to the first side; and a plurality of circuits, each of which is connected to a respective one of the plurality of ultrasonic elements. Each of the plurality of circuits includes a first output connected to the first electrode of the respective one of the plurality of ultrasonic transducer elements and a second output connected to the second electrode of the respective one of the plurality of ultrasonic transducer elements. Moreover, each of the first outputs provides a first voltage, each of the second outputs provides a second voltage and each of the circuits provides a voltage to the active layer of its respective one of the plurality of ultrasonic transducer elements that is equal to approximately a difference between the first voltage and the second voltage.

In accordance with another example embodiment, an ultrasonic probe includes a housing and a cable assembly. The ultrasonic probe also includes an ultrasonic transducer array disposed in the housing and having a plurality of ultrasonic transducer elements. Each of the plurality of ultrasonic transducer elements includes an active layer having a first side and a second side; a first electrode connected to the first side and a second electrode connected to the first side.

The probe also includes a plurality of circuits each of which is connected to a respective one of the plurality of elements. Each of the plurality of circuits includes a first output connected to the first electrode of the respective one of the plurality of ultrasonic transducer elements and a second output connected to the second electrode of the respective one of the plurality of ultrasonic transducer elements. Each of the first outputs provides a first voltage, each the second outputs provides a second voltage and each of the circuits provides a voltage to the active layer of its respective one of the plurality of ultrasonic transducer elements that is equal to approximately a difference between the first voltage and the second voltage.

The invention is best understood from the following detailed description when read with the accompanying drawing figures. It is emphasized that the various features are not necessarily drawn to scale. In fact, the dimensions may be arbitrarily increased or decreased for clarity of discussion.

Figure 3A:
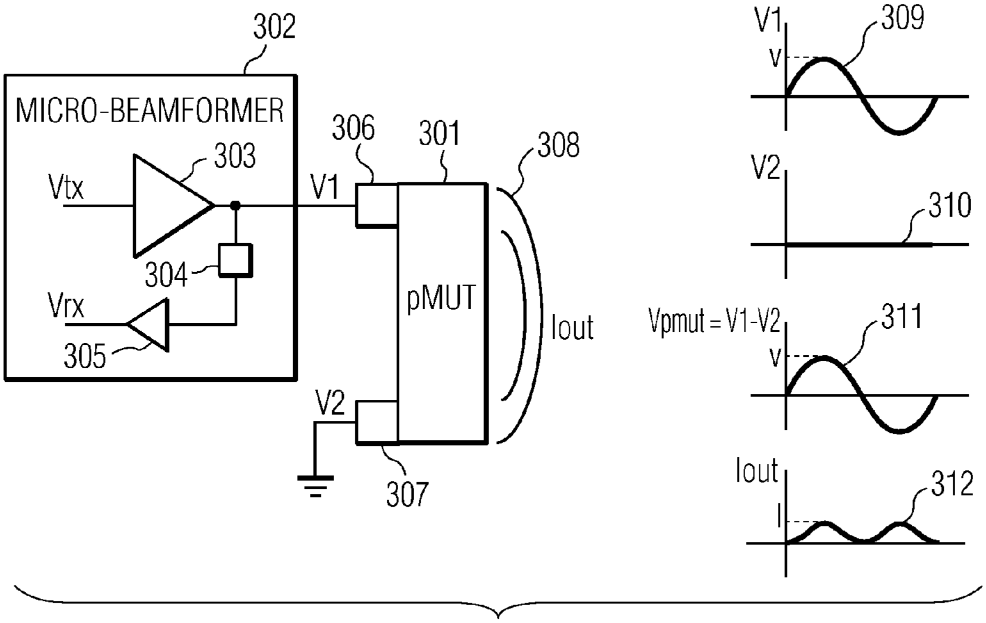

FIG. 3*a* is simplified schematic diagram of an ultrasonic transducer element and circuit, graphs of voltage versus time and a graph of transducer power versus time.

Figure 3B:
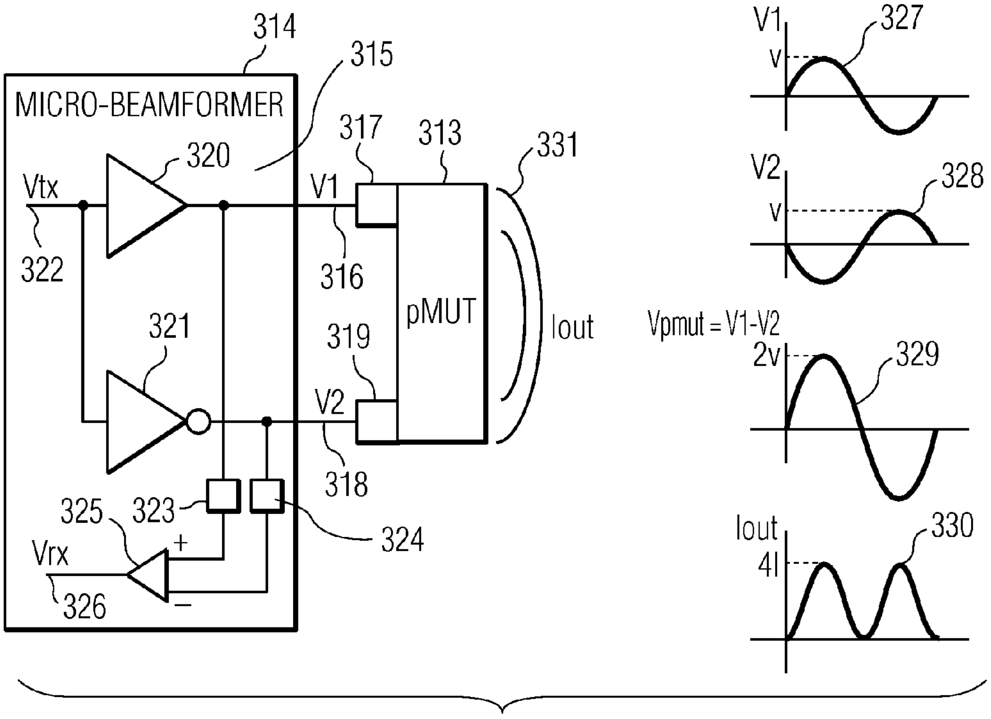

FIG. 3*b* is a simplified schematic diagram of an ultrasonic transducer element and circuit, graphs of voltage versus time, and a graph of acoustic intensity versus time, in accordance with an example embodiment.

In the following detailed description, for purposes of explanation and not limitation, example embodiments disclosing specific details are set forth in order to provide a thorough understanding of the present teachings. However, it will be apparent to one having ordinary skill in the art having had the benefit of the present disclosure that other embodiments that depart from the specific details disclosed herein are contemplated. Moreover, descriptions of well-known devices, methods, systems and protocols may be omitted so as to not obscure the description of the example embodiments. Nonetheless, such devices, methods, systems and protocols that are within the purview of one of ordinary skill in the art may be used in accordance with the example embodiments. Finally, wherever practical, like reference numerals refer to like features.

Figure 1:
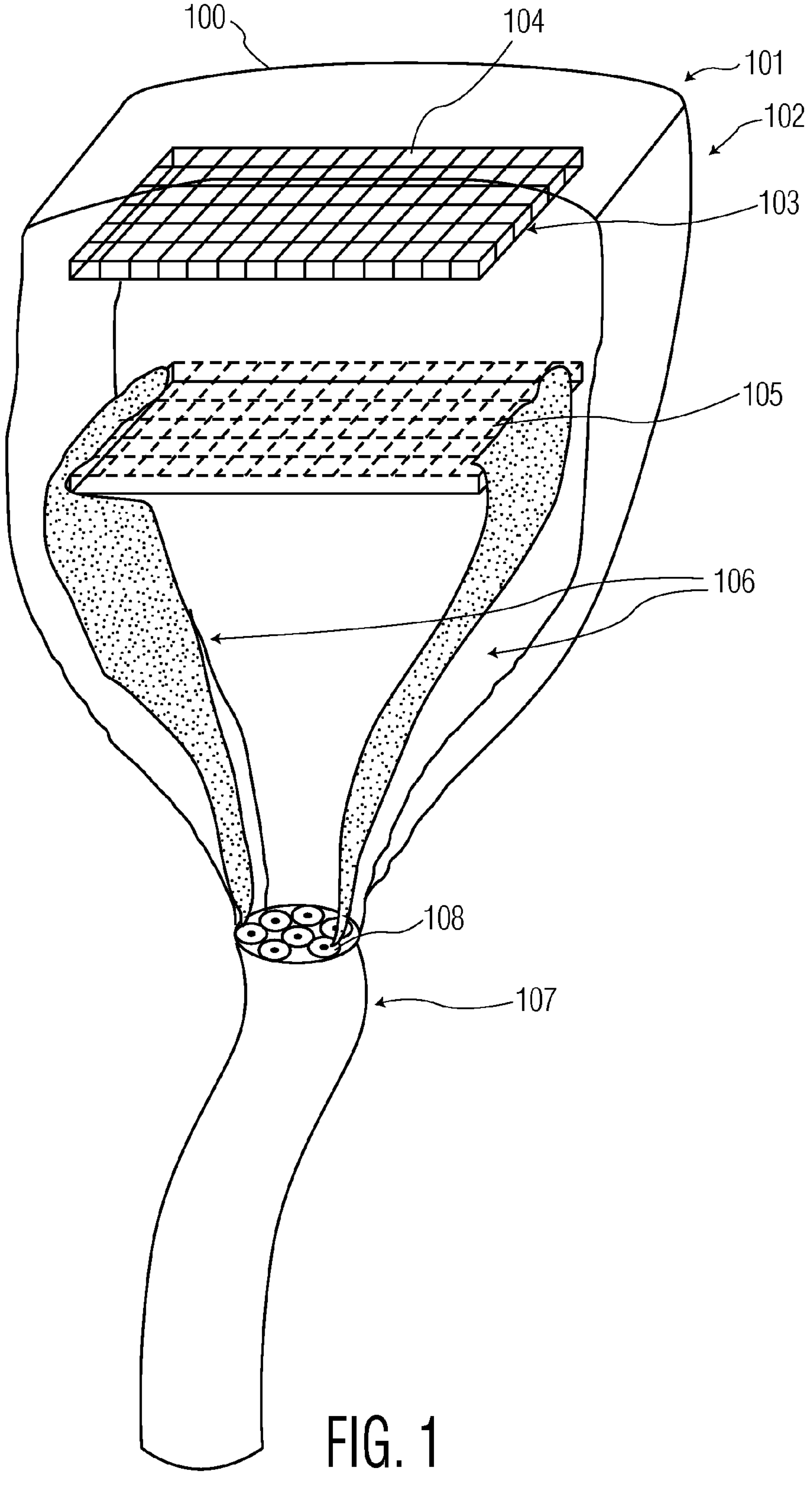
FIG. 1 is partially exploded view of an ultrasonic probe in accordance with an example embodiment.

FIG. 1 is a partially exploded view of an ultrasonic probe 100 in accordance with an example embodiment. The probe 100 comprises a lens 101 and a housing 102. The lens 101 is adapted for directing ultrasonic waves to and from the probe and may be one of a variety of lens elements within the purview of one of ordinary skill in the art. The housing 102 is adapted for ready handling by a technician administering the ultrasonic testing. Illustratively, the probe 100 is used for medical testing of humans and animals, but is not limited to this use. For example, the probe 100 may be used in scientific imaging and other types of non-invasive imaging and testing. Many alternate applications of the probe 100 will become apparent to one of ordinary skill in the art, who has had the benefit of the present disclosure.

The probe 100 includes an array 103 of ultrasonic transducers elements 104. In a specific embodiment the transducer elements 104 are PMUTs. Illustratively, the PMUT array 103 is manufactured from a silicon wafer or other semiconductor wafer and includes a plurality of individual transducer elements 104. In an example embodiment, the PMUT array comprises a plurality of PZT membrane transducer elements. Illustratively, the array 103 and transducer elements 104 and their fabrication may be as described in U.S. Pat. No. 6,314,057 to Solomon, et al.; or U.S. Pat. No. 6,784,600 to Klee, et al.; or U.S. Pat. No. 6,592,525 to Miller, et al. These patents are assigned to the present assignee. The array 103 and transducer elements 104 and their fabrication may also be as described in U.S. Pat. No. 5,596,292 to Bernstein. The disclosures of the above-referenced patents are specifically incorporated herein by reference.

In a specific embodiment, the PMUT array 103 is a two-dimensional (2D) array, adapted to garner images in two orthogonal planes. The data gathered by the transmission and reception of ultrasonic waves by the array 103 may be processed by an electronic device (not shown) to provide images in three dimensions (3D). Moreover, the data gathered from the array 103 can be processed to provide cross-sections of a specimen and rotational views in three-dimensions.

Beneath the array 103 is a microbeamformer 105, which is an integrated circuit. The microbeamformer 105 provides circuitry used in the transmission and reception of the ultrasonic waves from the probe 100. Beneficially, the microbeamformer 105 enables the connection of a relatively large number of transducer elements 104 to a relatively small number of coaxial cables 108 disposed in a cable 107. To this end, the array 103 may include thousands of ultrasonic transducer elements 104. In example embodiments described herein, each of the ultrasonic transducer elements 104 includes at least two electrical connections through which a signal is transmitted. The transmission of power and signals via the cables 108 would be unduly cumbersome if each element 104 were connected to one cable 108. For example, in some arrays there are 6800 transducer elements, which would require 6800 cables. This would be wholly impractical. Beneficially, the microbeamformer 105 provides multiple signals to/from multiple transducers. Thereby the number of coaxial cables 108 required is reduced to a more manageable number.

The microbeamformer 105 includes delay lines, amplifiers and control circuits that control the amplifiers and control circuits. The delay lines are illustratively analog memory elements and the memory elements are associated with the transducer elements. By varying the delay times of the delay lines, images are formed at a display. The microbeamformer 105 is as described in U.S. Pat. No. 6,380,766 to Savord, the disclosure of which is specifically incorporated herein by reference. In an example embodiment described herein, the microbeamformer 105 also includes a plurality of circuits each of which is connected to a respective one of the transducer elements 104, and is adapted to drive the transducer element.

The connections from the PMUT array 103 to the microbeamformer 105 and to the cables 108 may be carried out in accordance with U.S. Pat. No. 5,990,598 to Sudol, et al., the disclosure of which is specifically incorporated herein by reference. Notably, flexible circuitry 106 may be used to make final connections between the microbeamformer 105 and the cable 107. Finally, in an example embodiment, the transducer array 103 and the microbeamformer 105 may be an integral element fabricated using known semiconductor processing and a known technique for deposition of a piezoelectric material.

In operation, power and signals from the electronic equipment (not shown) are provided to the microbeamformer chip 105 and to the array 103 of elements 104. The array transmits ultrasonic waves that are reflected by the specimen (e.g., human body) and are again incident on the array 103. The reflected signals are converted back into electrical signals and provided to the microbeamformer 105, which in turn provides processed signals to the electronic device via cables 108 for further processing and display.

Figure 2:
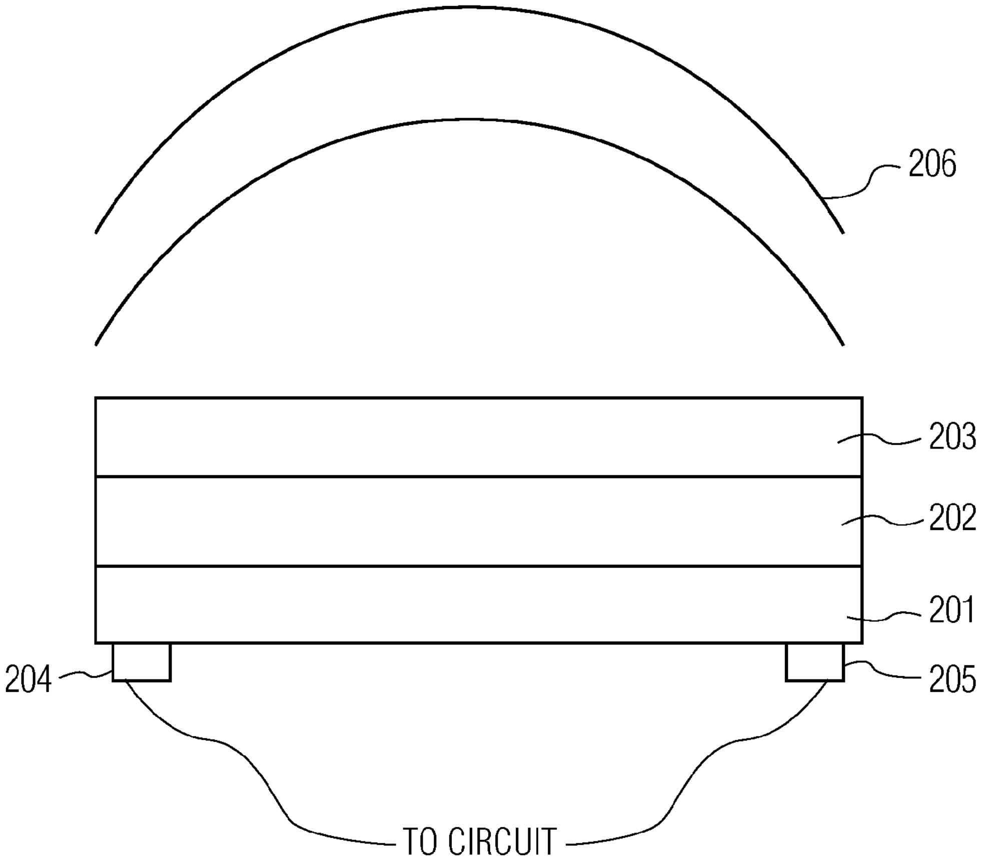
FIG. 2 is cross-sectional view of an ultrasonic transducer element in accordance with an example embodiment.

FIG. 2 is a cross-sectional view of a transducer element 104 in accordance with an example embodiment. The transducer element includes an active layer 201, which is adapted to oscillate when stimulated by a time-dependent voltage. For example, the active layer 201 may be PZT or other suitable piezoelectric material. A first layer 202 is disposed over the active layer 201 and is illustratively silicon dioxide ($SiO_2$), which acts as a spacer layer. A second layer 203 is disposed over the second layer and is illustratively silicon nitride ($Si_3N_4$). The second layer 203 acts to provide some rigidity to the structure of the element 104. It is noted that the array 103 of elements 104 may be fabricated using known semiconductor fabrications techniques and a known technique for depositing piezoelectric material. For example, a semiconductor (e.g., silicon) wafer (not shown) may be used as the substrate over which the layers 201-203 are formed. This semiconductor substrate may then be removed by standard etching or other known techniques.

In example embodiments, a first electrode 204 and a second electrode 205 are connected to same side of the active layer 201. In a specific embodiment, the first and second electrodes 204,205 are connected to the back-side of the transducer 104, which is the side opposite to the side from which ultrasonic signals propagate into the specimen. In addition to other benefits, having the electrodes 204, 205 on the same side of the active layer facilitates fabrication of the ultrasonic transducer element 104 and reduces the complexity of making electrical connections to the ultrasonic transducer element 104, particularly when the elements 104 are in an array such as array 103.

In an embodiment, the electrodes 204, 205 are conductive bumps are connected to circuitry of the microbeamformer 105, as described more fully herein. In another embodiment, the electrodes 204, 205 are line contacts, which allow the array 103 of transducers 104 to make direct contact to respective contacts of the circuitry, which is part of the microbeamformer 105. Alternatively, the connections between the array 103 and the microbeamformer 105 may be made using a conductive adhesive, ultrasonic welding or low-temperature soldering. Regardless of the technique used to make the connection, the circuitry of the microbeamformer 105 drives the transducer 104 causing the transducer 104 to emit ultrasonic waves 206.

As will become clearer as the present description continues, the electrodes 204, 205 are both 'hot' and neither is connected to ground. This reduces the magnitude of the drive voltages fed through the microbeamformer 105 that are required to provide a suitable ultrasonic wave amplitude (acoustic intensity) for imaging at sufficient depth in the human body or other specimen.

FIG. 3*a* is a simplified schematic diagram of an ultrasonic transducer element 301 that is connected to a microbeamformer 302. The microbeamformer 302 includes a driver 303, a switch 304 and an amplifier 305, which is connected to receiver circuitry (not shown). The driver 303 is illustratively a power amplifier or other device known to one of ordinary skill in the art. The microbeamformer 302 is connected to a first electrode 306 and supplies the input voltage therethrough. A second electrode 307 is connected to ground. Upon application of an oscillating voltage to the first electrode 306, an output ultrasonic signal 308 is realized.

Curve 309 shows a representative input voltage signal versus time to the first electrode 306. Curve 310 shows the connection to ground of the second electrode 307 versus time. Curve 311 shows the voltage output over time by the microbeamformer 302 to the transducer element 301. Finally, curve 312 shows the acoustic intensity of the output signal 308 (ultrasonic wave) versus time during the application of the voltage of curve 309. Notably, the intensity reaches a maximum value on a relative scale denoted T on curve 312.

While the known transducer element 301 is useful, the microbeamformer 302 is limited to providing between approximately 50 V and approximately 100 V (shown as 'v' in curve 311) to the transducer element 301. However, in order to garner images at a suitable depth in a specimen, input voltages of approximately 100 V to approximately 300 V are required when implementing the structure of the known transducer element 301. This can result in unacceptable image quality.

FIG. 3*b* is a simplified schematic diagram of an ultrasonic transducer element 313 in accordance with an example embodiment. The transducer element 313 is connected to a microbeamformer 314, which comprises a circuit 315 and other circuits and delays lines (not shown), and as described previously. The microbeamformer 314 includes an input 322 that provides input voltage signals to the circuit 315. The circuit 315 includes a first output 316 that provides a first voltage signal (V1) to a first electrode 317 of the transducer element 313; and a second output 318 that provides a second voltage signal (V2) to a second electrode 319 of the transducer element 313.

Notably, a variety of known circuits may be realized to provide the first and second voltages to the transducer element 313. For purposes of illustration and not limitation, known push-pull circuits and known balanced transmitter circuits may be used. As such, it is emphasized that the circuit 315 shown in and described in connection with FIG. 3*b* is merely illustrative and that a variety of other circuits may be implemented to provide the first and second voltages to the transducer element 313.

In a specific embodiment, the circuit 315 includes a first amplifier 320 and a second amplifier 321. Illustratively, the second amplifier 321 has an inverted input. The amplifiers 320,321 function as drivers for the transducer element 313. It is emphasized that other types of driver circuits may be used instead of the amplifiers 320,321 of the present embodiment. Such drivers are within the purview of one of ordinary skill in the art.

As detailed herein, the transducer element 313 may be one of the transducer elements 104 of the array 103, and the microbeamformer 314 may be implemented as the microbeamformer 105, described previously. The microbeamformer 314 includes a plurality of circuits 315, with each transducer element 313 being connected to a respective one of the circuits 315 and thus being a channel of the microbeamformer 314. For example, in the example embodiment shown and described in connection with FIG. 1, the microbeamformer 105 comprises a plurality of circuits 315 as well as other circuits referenced previously for use in delay, amplification and control. Each transducer element 104 of the array 103 is connected to a respective one of the circuits 315. In this arrangement, each of the transducers is a channel of the microbeamformer 105. Furthermore, and as noted previously, while each transducer element 313 is connected to a circuit 315, the microbeamformer processes the signals received from a large number of transducers and provides the signals to many fewer channels in the cable 107. Thereby, fewer coaxial cables are required to transmit signals to and from the array 103 of transducer elements 103.

The circuit 315 includes switches 323,324, which are connected to a receive amplifier 325. Reflected ultrasonic signals received by the transducer element 313 are converted to electrical signals, which are fed through electrodes 317,319 to the amplifier 325. The amplifier 325 then provides an output signal 326 to the electronics (not shown) for further processing and image display.

In a specific embodiment, the receive amplifier 325 is a balanced circuit such as shown in FIG. 3*b*. However, this is not essential. In particular, because the intensity of the reflected ultrasonic waves incident on the transducer are significantly attenuated compared to the transmitted ultrasonic waves, the input voltage levels at the receive amplifier 325 are well within the specified operational voltages of the microbeamformer 314. Accordingly, the receive amplifier 325 may be an unbalanced circuit, with one connection of the amplifier 323 being connected to ground.

The transducer element 313 is able to provide a sufficient ultrasonic signal intensity/amplitude although the input voltage signals from the microbeamformer 314 are relatively low. To this end, the circuit 315 provides a first voltage signal over time as shown in curve 327 to the first electrode 317 and a second voltage signal over time as shown in curve 328 to the second electrode 319.

In a specific embodiment, the second voltage signal (V2) applied to the second electrode 319 over a cycle is at every point in time inverted relative to the first voltage signal (V1). The result is the application of a peak-to-peak voltage V to the transducer that is approximately 1.75 to approximately 2.0 times the peak-to-peak voltage of either the first voltage signal or the second voltage signal.

In another specific embodiment, the first voltage signal is the time inverse of the second voltage signal and has an amplitude of equal magnitude. For example, as shown in FIG. 3B, the first voltage signal (curve 327) and the second voltage signal (curve 328) are sinusoidal in shape and substantially the same amplitude but of opposite sign. However, this is not essential. In other illustrative embodiments, the first voltage signal applied to the first electrode 317 and the second voltage signal applied to the second electrode 319 are not necessarily inverse in nature or having amplitudes of substantially equal magnitudes, or both. For example, for various reasons it may be useful to have independent inputs to each amplifier 320, 321. The first and second voltages applied are not necessarily inverted at each point in time, or not necessarily of substantially the same amplitude, or both.

In general, the voltage applied across the transducer element 313 over time is the difference (over time) between the first voltage signal (V1) applied to the first electrode 317 and the second voltage signal (V2) applied to the second electrode 319. The voltage difference $V_{pmut}$ between the first voltage signal and the second voltage signal approximately equals the voltage to the active layer of the transducer element 313, and is shown as curve 329 over the time period of curves 327 and 328.

Illustratively, the peak voltage of curve 327 and the peak voltage of curve 328 are in the range of approximately 50 V to approximately 100 V, which is within the operational range of the microbeamformer 314. However, in the present illustrative embodiment, because of the inverse nature and the substantially identical magnitude of the amplitudes of the first and second voltages applied at opposite ends of the transducer element 313, the voltage (curve 329) applied across the active layer of the transducer element 313 has a magnitude that is approximately twice the magnitude of either of the first or the second voltages. This results in an output (acoustic) intensity shown in curve 330 of the transmitted ultrasonic signal 331. This output intensity is within the desired ranges for ultrasonic imaging, without exceeding the voltage limits placed on the microbeamformer 314.

Beneficially, for the same input voltage level (amplitude V), the transducer element 313 of an example embodiment provides a four-fold increase in intensity compared to the known transducer element 301. This is readily apparent from a comparison of curves 312 and 330, where the peak acoustic intensity levels are $I_{out}$ and $4I_{out}$, respectively. Accordingly, the benefits of the microbeamformer may be realized without sacrificing the image quality due to lower power capabilities of the microbeamformer.

In view of this disclosure it is noted that the various methods and devices described herein can be implemented in hardware and software. Further, the various methods and parameters are included by way of example only and not in any limiting sense. In view of this disclosure, those skilled in the art can implement the various example devices and methods in determining their own techniques and needed equipment to effect these techniques, while remaining within the scope of the appended claims.

The invention claimed is:

1. An ultrasonic transducer array, comprising:

a plurality of micromachined ultrasonic transducer elements produced by a semiconductor fabrication technique, each of the plurality of micromachined ultrasonic transducer elements comprising:

an active layer which is adapted to oscillate when stimulated by a time-dependent voltage;

a first electrode and a second electrode connected to each micromachined ultrasonic transducer element; and a microbeamformer comprising a plurality of transducer drive circuits each of which is connected to a respective one of the plurality of ultrasonic transducer elements, and each of the transducer drive circuits comprises:

a first output connected to the first electrode of the respective one of the plurality of ultrasonic transducer elements and a second output connected to the second electrode of the respective one of the plurality of micromachined ultrasonic transducer elements, wherein each of the first outputs provides a first voltage signal which varies over time, each of the second outputs provides a second voltage signal which varies over time in inverse relation to the first voltage signal, wherein the peak-to-peak voltage applied to the first and second electrodes of the micromachined ultrasonic transducer elements is greater than the peak-to-peak voltage of either the first voltage signal or the second voltage signal.

2. An ultrasonic transducer array as recited in claim 1, wherein the peak-to-peak voltage applied to the first and second electrodes is approximately 1.75 to approximately 2.0 times the peak-to-peak value of either the first voltage signal or the peak-to-peak value of the second voltage signal.

3. An ultrasonic transducer array as recited in claim 1, wherein the first output is connected to a driver circuit.

4. An ultrasonic transducer array as recited in claim 1, wherein the second output is connected to a driver circuit.

5. An ultrasonic transducer array as recited in claim 4, wherein the driver circuit is an inverting driver circuit.

6. An ultrasonic transducer array as recited in claim 1, wherein a peak-to-peak value of the voltage applied to the micromachined ultrasonic transducer elements is the sum of a peak-to-peak value of the first voltage signal and a peak-to-peak value of the second voltage signal.

7. An ultrasonic probe comprising:

a housing;

an ultrasonic transducer array disposed in the housing and having a plurality of micromachined ultrasonic transducer elements fabricated by a semiconductor technique, each of the plurality of micromachined ultrasonic transducer elements comprising:

an active layer which is adapted to oscillate when stimulated by a time-dependent voltage;

a first electrode and a second electrode connected to the transducer element; and a microbeamformer comprising a plurality of drive circuits each of which is connected to a respective one of the plurality of elements, and each of the plurality of circuits comprises:

a first output connected to the first electrode of the respective one of the plurality of ultrasonic transducer elements and a second output connected to the second electrode of the respective one of the plurality of ultrasonic transducer elements, wherein each of the first outputs provides a first voltage signal which varies over time, and each of the second outputs provides a second voltage signal which varies over time in inverse relation to the first voltage signal, wherein the peak-to-peak voltage applied to the first and second electrodes of the micromachined ultrasonic transducer elements is greater than the peak-to-peak voltage of either the first voltage signal or the second voltage signal.

8. An ultrasonic probe as recited in claim 7, wherein the peak-to-peak voltage applied to the first and second electrodes is approximately 1.75 to approximately 2.0 times either the peak-to-peak value of either the first voltage signal or the peak-to-peak value of the second voltage signal.

9. An ultrasonic probe as recited in claim 7, wherein the first output is connected to a driver circuit.

10. An ultrasonic probe as recited in claim 7, wherein the second output is connected to a driver circuit.

11. An ultrasonic probe as recited in claim 7, wherein the peak-to-peak value of the voltage applied to the micromachined ultrasonic transducers elements is the sum of a peak-to-peak value of the first voltage signal and a peak-to-peak value of the second voltage signal.

* * * * *